United States Patent [19]
Hsu

[11] Patent Number: 5,946,558
[45] Date of Patent: Aug. 31, 1999

[54] METHOD OF MAKING ROM COMPONENTS

[75] Inventor: Chen-Chung Hsu, Taichung, Taiwan

[73] Assignee: United Microelectronics Corp., Hsinchu, Taiwan

[*] Notice: This patent is subject to a terminal disclaimer.

[21] Appl. No.: 08/866,130

[22] Filed: May 30, 1997

[30] Foreign Application Priority Data

Feb. 5, 1997 [TW] Taiwan .................................. 86101462

[51] Int. Cl.⁶ .................................................... H01L 21/82
[52] U.S. Cl. .......................... 438/130; 438/278; 438/275; 257/390
[58] Field of Search .................................... 438/130, 278, 438/275; 257/390

[56] References Cited

U.S. PATENT DOCUMENTS 5,084,418  1/1992  Esquivel et al. .......................... 438/301
5,712,203  1/1998  Hsu ......................................... 438/275

Primary Examiner—John F. Niebling
Assistant Examiner—John Murphy
Attorney, Agent, or Firm—Rabin & Champagne, P.C.

[57] ABSTRACT

A method of making a read only memory device includes forming a gate oxide layer and a silicon nitride layer in sequence above a silicon substrate. The gate oxide layer and the silicon nitride layer are etched to define a plurality of parallel strips extending in a first direction. Ions are implanted, using the parallel strips as masks, into the silicon substrate to form a plurality of buried bit lines extending in the first direction. A sidewall spacer is formed on respective sidewalls of the parallel strips. A silicide layer is formed over an exposed surface of the respective bit lines. An insulating layer is formed to cover any exposed surfaces, and fill a space located between adjacent parallel strips and above the bit lines. A portion of the insulating layer is removed to expose the silicon nitride layer and form a planar surface. The silicon nitride layer is patterned to form a plurality of coding areas. A polysilicon layer is formed to cover the coding areas as well as any other exposed surfaces. The polysilicon layer is patterned to form a plurality of parallel word lines extending in a second direction perpendicular to the first direction. The word lines cover the coding areas and cross the bit lines. The area where each word line crosses with two adjacent bit lines forms a read only memory cell. A self-aligned coding operation is performed to define the read only memory cells as having an on or off state.

13 Claims, 5 Drawing Sheets

METHOD OF MAKING ROM COMPONENTS

BACKGROUND OF THE INVENTION

1. Field of Invention

This invention relates in general to a process of manufacturing integrated circuits. More particularly, the present invention relates to a method of making read-only-memory (ROM) components.

2. Description of Related Art

With the progression of semiconductor production techniques, the component density of the ROM device and the masking of the ROM device, in particular, have increased in harmony with the chosen silicon chip size. Moreover, the structure of a basic memory cell unit has also changed from the conventional two-state memory unit structure to the X-cell unit structure, followed by the flat cell unit structure and then to an improved version known as the modified flat cell unit structure.

In general, the commonly used ROM devices employ channel transistors as the basic memory units. Program coding is performed by selectively implanting impurities into designated channel regions so as to adjust their threshold voltages, which sets each conductive channel to an ON or an OFF state.

FIG. 1 is a top view showing a conventional masked ROM device. FIG. 2 is a cross-sectional view taken along line II—II in FIG. 1. Conventional masked ROM devices are formed above a P-doped silicon substrate 100 by first doping N+ ions into source/drain regions 104 which extend in a first direction to form bit lines. Next, gate electrodes 106 are formed, which extend in a second direction perpendicular to the first direction and over a gate oxide layer 102 that covers the silicon substrate 100.

The gate electrodes 106 form word lines. Transistor channels are formed underneath the word lines in areas between two adjacent bit lines. By adjusting the conductivity of the transistor channels, two-state memory units, each having either a "0" state or a "1" state, are formed.

One method of setting a designated transistor channel into an OFF state is by implanting P-type impurities (i.e., performing a coding implant), which results in a higher threshold voltage for those channels. For example, one such transistor 108 is shown in FIGS. 1 and 2.

When the conventional ROM device described above undergoes further component miniaturization, the resistance of the bit lines will increase due to a diminishing line width. As a result, the operational speed of the components may be affected. Additionally, this will entail prominent body effect which will lead to a reduction in component quality.

SUMMARY OF THE INVENTION

It is therefore an object of this invention to provide a method of making a ROM component having bit lines with a reduced resistance, an increased operational speed of the components, and a reduced impact of body effect.

To achieve the above objects, the present invention includes forming a gate oxide layer and a silicon nitride layer in sequence above a silicon substrate. The gate oxide layer and the silicon nitride layer are etched to define a plurality of parallel strips extending in a first direction. Ions are implanted, using the parallel strips as masks, into the silicon substrate to form a plurality of buried bit lines extending in the first direction. A sidewall spacer is formed on respective sidewalls of the parallel strips. A silicide layer is formed over an exposed surface of the respective bit lines. An insulating layer is formed to cover any exposed surfaces, and fill a space located between adjacent parallel strips and above the bit lines. A portion of the insulating layer is removed to expose the silicon nitride layer and form a planar surface. The silicon nitride layer is patterned to form a plurality of coding areas. A polysilicon layer is formed to cover the coding areas as well as any other exposed surfaces. The polysilicon layer is patterned to form a plurality of parallel word lines extending in a second direction perpendicular to the first direction. The word lines cover the coding areas and cross the bit lines. The area where each word line crosses with two adjacent bit lines forms a read only memory cell. A self-aligned coding operation is performed to define the read only memory cells as having an on or off state.

Other objects, features, and advantages of the invention will become apparent from the following detailed description of the preferred but non-limiting embodiment. The description is made with reference to the accompanying drawings.

DESCRIPTION OF THE PREFERRED EMBODIMENT

Figure 1:
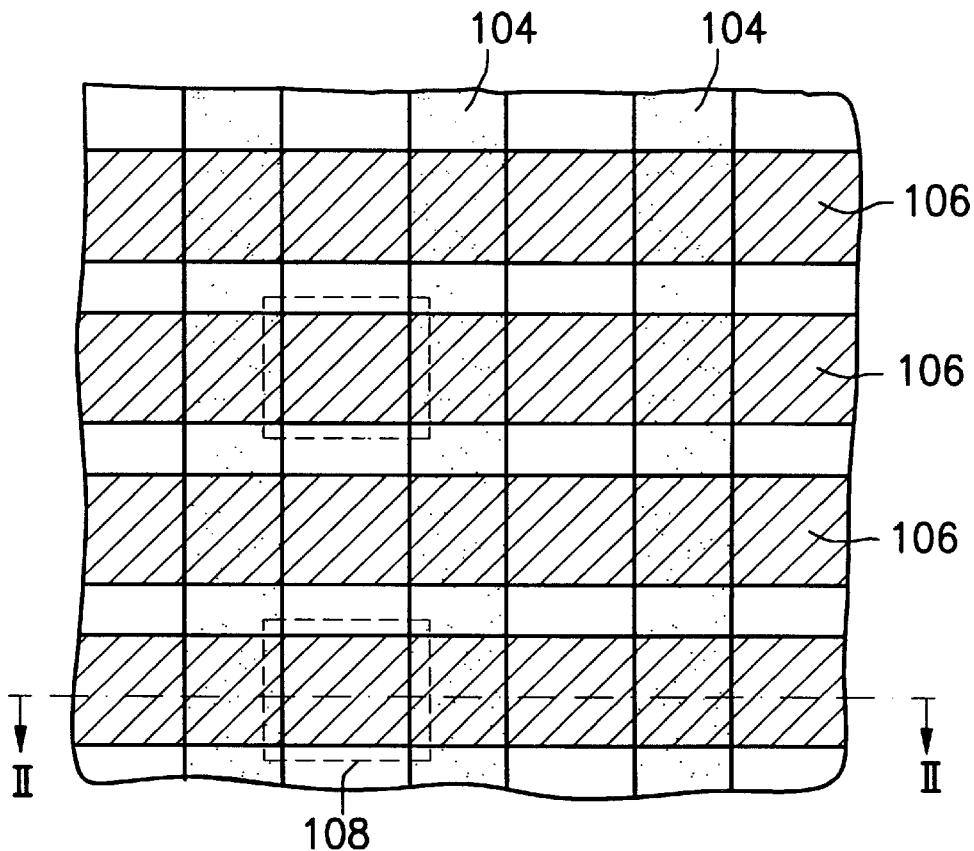
FIG. 1 is a top view of a conventional ROM device formed using an ion coding implantation process.
Figure 2:
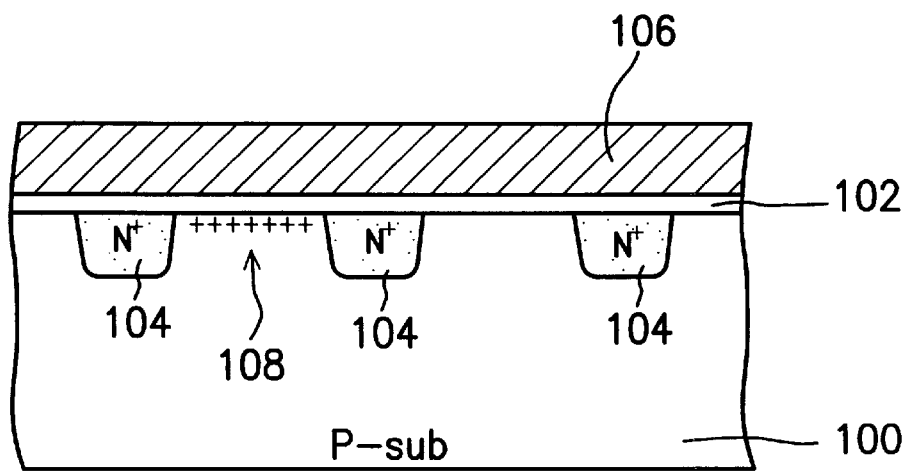
FIG. 2 is a cross-sectional view taken along line II—II in FIG. 1.
Figure 3A:
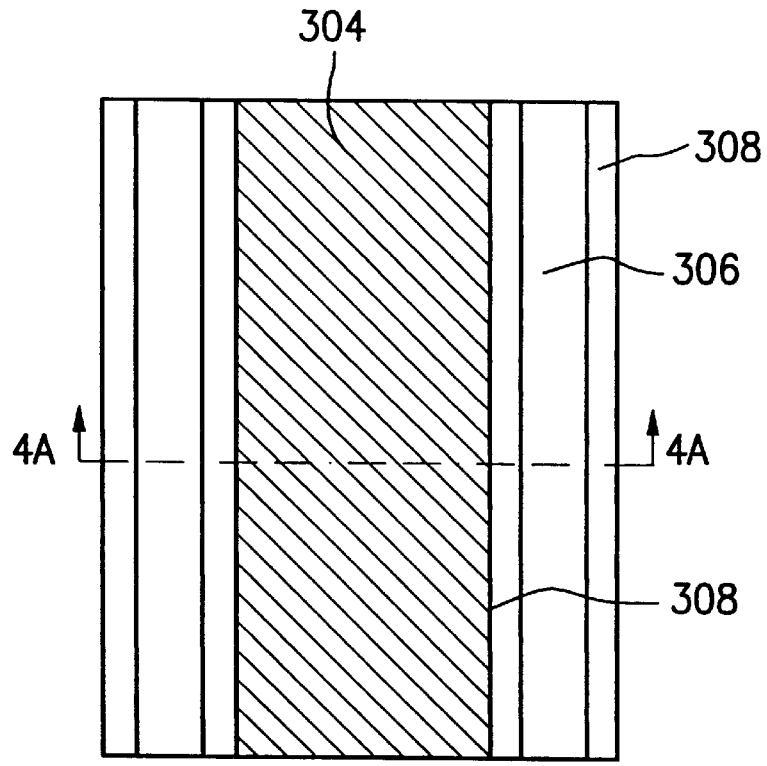
FIGS. 3A through 3D are top views of the present invention, during various stages of manufacture.
Figure 4A:
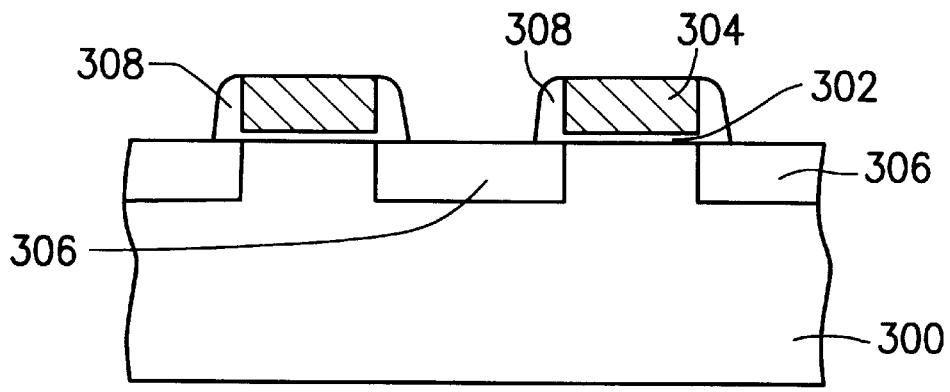
FIGS. 4A through 4F are cross-sectional views of the present invention, during various stages of manufacture.

Referring to FIG. 3A and FIG. 4A (which is a cross-sectional view of FIG. 3A taken along line 4A—4A), a gate oxide layer 302 is formed above a silicon substrate 300 using either a thermal oxidation or a chemical vapor deposition method. Then, a silicon nitride layer 304 is formed above the gate oxide layer 302. This is followed by defining the gate oxide layer 302 and the silicon nitride layer 304 using photolithographic and etching processes to form a plurality of long parallel strips of silicon nitride extending in a first direction.

Next, and using the long parallel strips of silicon nitride as masks, ions are implanted into the silicon substrate 300 using, for example, N-type ions, to form a plurality of buried bit lines 306. Thereafter, sidewall spacers 308 are formed on the exposed sidewalls of the long parallel strips. Sidewall spacers 308 may be composed of, for example, silicon dioxide.

Figure 3B:
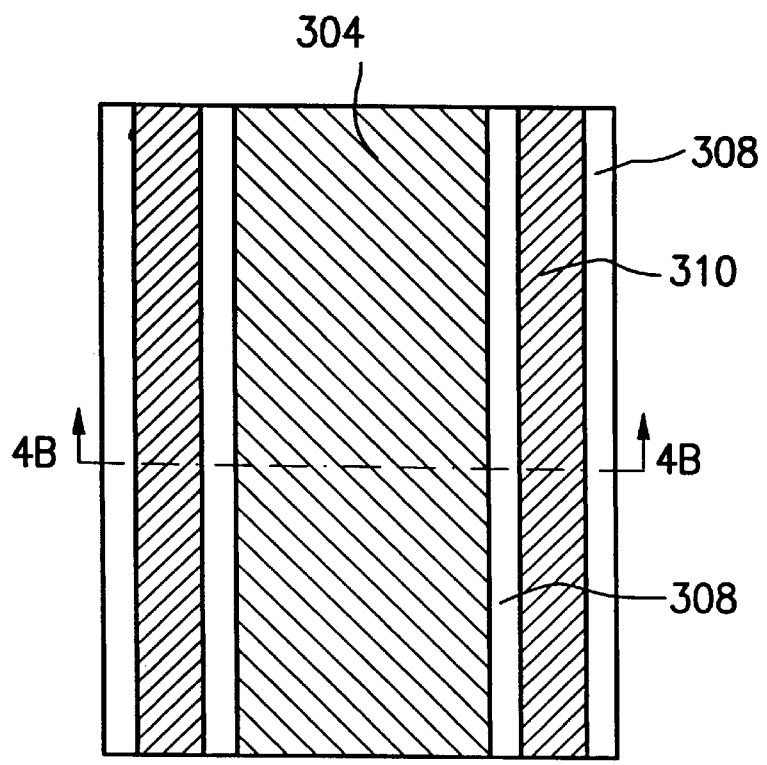
Figure 4B:
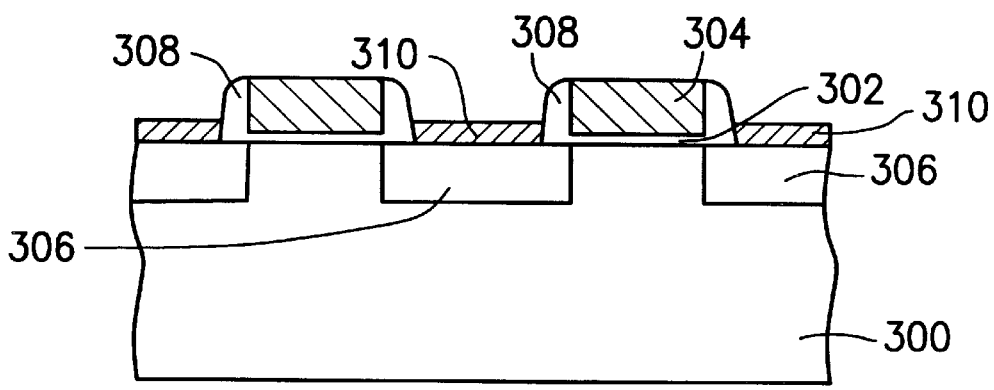

Referring next to FIG. 3B and FIG. 4B (which is a cross-sectional view of FIG. 3B taken along line 4B—4B), a silicide layer 310, for example, titanium silicide (TiSi$_2$) or tungsten silicide (WSi$_2$), is formed self-aligned above the exposed surfaces of the buried bit lines 306 so as to increase the bit lines electrical conductivity.

Figure 4C:
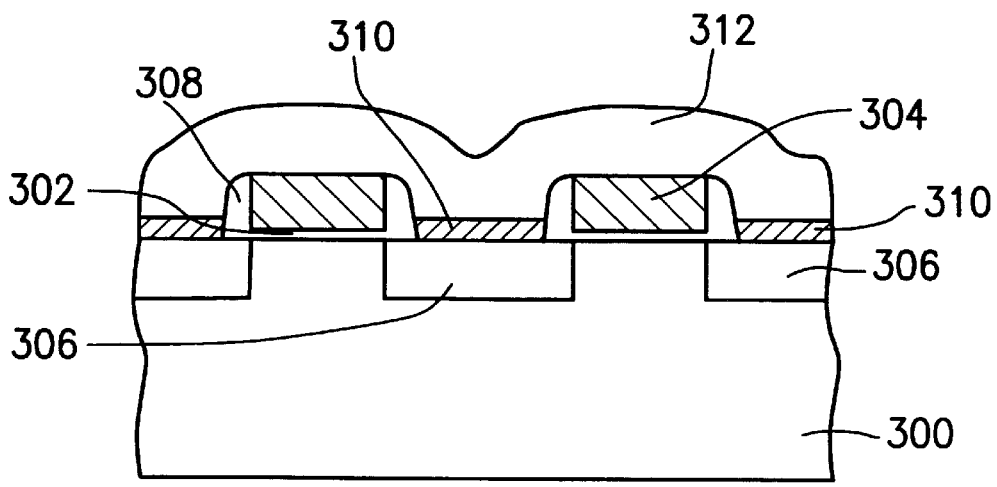

Referring next to FIG. 4C, a relatively thick insulating layer 312 composed, for example, of silicon dioxide or boro-phosphosilicate glass, is formed over the existing structure to fill the space above the buried bit lines 306 and cover the surfaces of the existing layers.

Figure 4D:
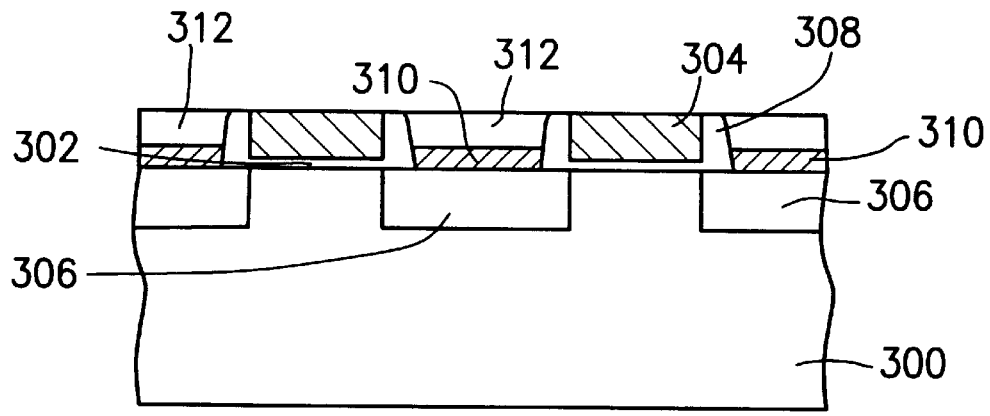

Referring next to FIG. 4D, a portion of the insulating layer 312 is removed, using for example a chemical-mechanical polishing (CMP) method, until a planar surface is formed and the top of the silicon nitride layer 304 is exposed.

Figure 3C:
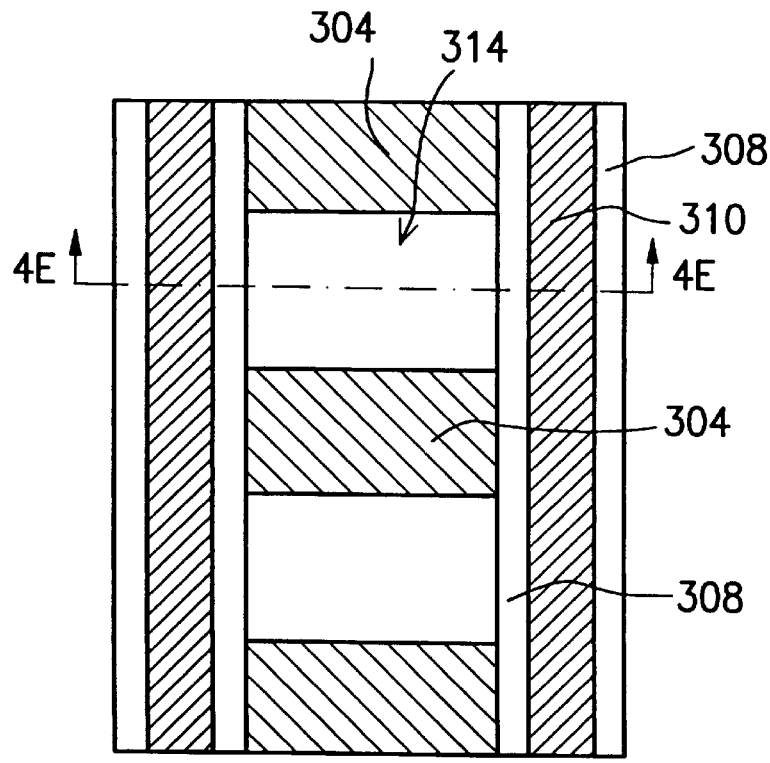
Figure 4E:
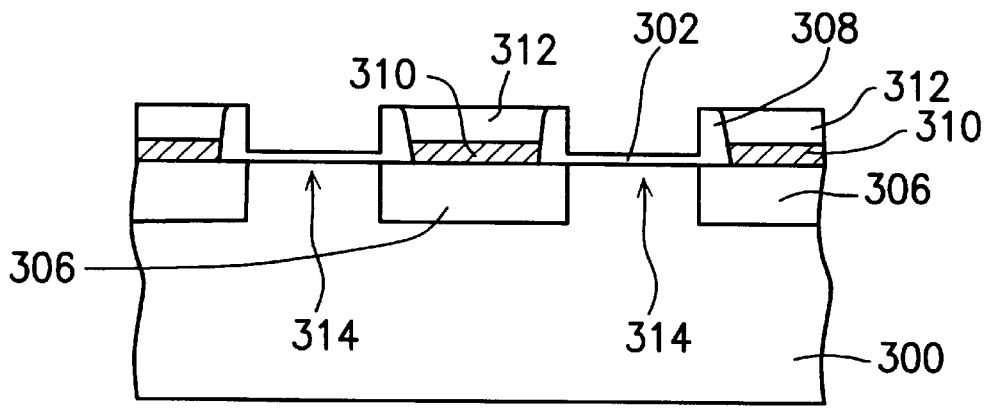

Referring next to FIG. 3C and FIG. 4E (which is a cross-sectional view of FIG. 3C taken along line 4E—4E), photolithographic and etching processes are used to define the silicon nitride layer 304 and form a plurality of coding areas 314.

Figure 3D:
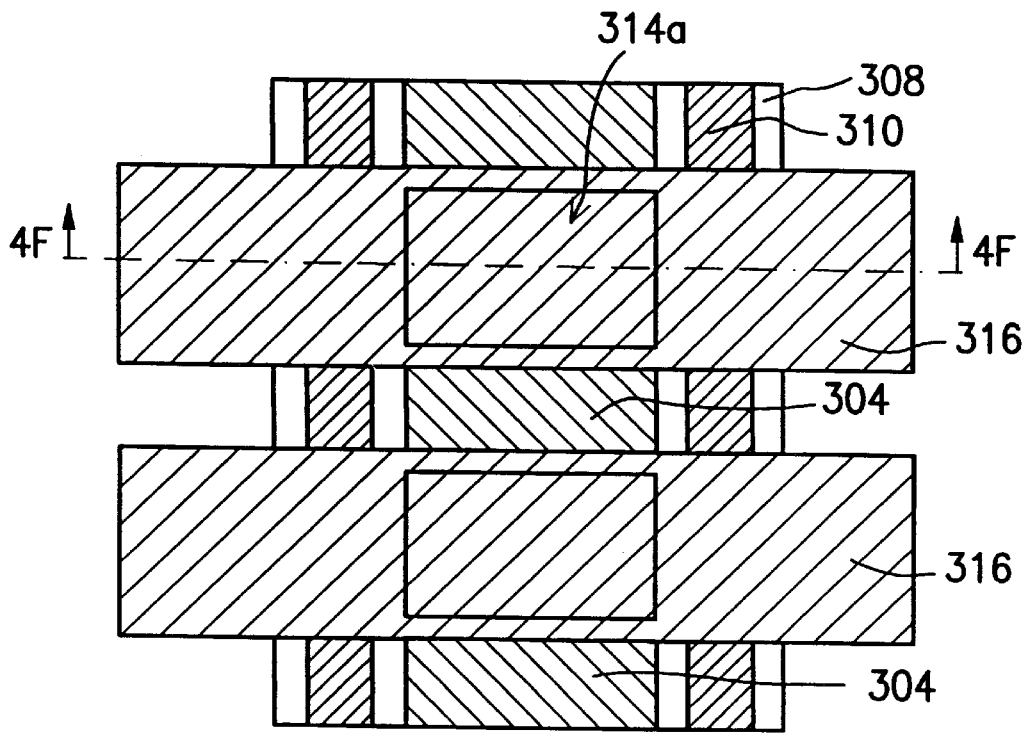
Figure 4F:
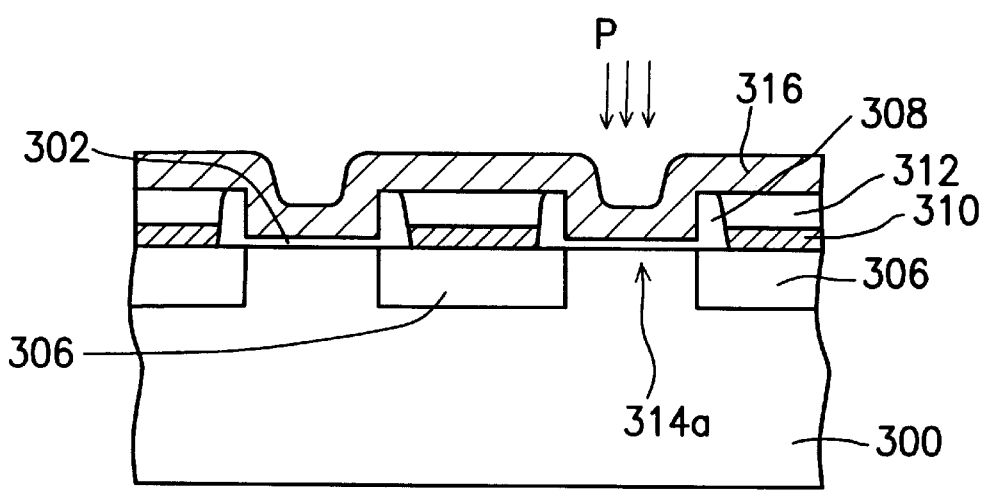

Referring next to FIG. 3D and FIG. 4F (which is a cross-sectional view of FIG. 3D taken along line 4F—4F), a polysilicon layer is deposited using a chemical vapor deposition method, to cover the coding areas 314 and the surfaces of existing layers. Next, photolithographic and etching techniques are used to define the polysilicon layer and form a plurality of parallel word lines 316 which extend in a second direction perpendicular to the first direction and cover portions of the coding areas 314. The areas where each word line 316 crosses over a pair of adjacent buried bit lines 306 constitute basic ROM memory units such as 314a.

Next, a self-aligned coding operation is performed. For example, P-type ions may be implanted into memory unit 314a, thereby creating an OFF state. Any memory units not implanted with the P-type ions have an ON state. Thus proper coding is achieved.

Lastly, subsequent procedures such as the laying of metallic wirings and passivation layers (not shown in the Figures) can be performed, in a manner similar to the later stages of manufacturing of a conventional ROM device. Since these procedures are conventional, detailed descriptions are omitted.

In summary, the ROM components produced according to the present invention have bit lines 306 which have a lower resistance due to the formation of silicide layer 310. As a result, the operational speed is increased, and the impact of the body effect is correspondingly lowered.

While the invention has been described by way of example and in terms of the preferred embodiment, it is to be understood that the invention is not limited to the disclosed embodiment. To the contrary, it is intended to cover various modifications and similar arrangements. Therefore, the scope of the appended claims, which define the invention, should be accorded the broadest interpretation so as to encompass all such modifications and similar structures.

What is claimed is:

1. A method of making a read only memory device, comprising:

forming a gate oxide layer and a silicon nitride layer in sequence above a silicon substrate;

etching the gate oxide layer and the silicon nitride layer to define a plurality of parallel strips extending in a first direction;

implanting ions, using the parallel strips as masks, into the silicon substrate to form a plurality of buried bit lines extending in the first direction;

forming a sidewall spacer on respective sidewalls of the parallel strips;

forming a silicide layer over an exposed surface of the respective bit lines;

forming an insulating layer covering any exposed surfaces, and filling a space located between adjacent parallel strips and above the bit lines;

removing a portion of the insulating layer to expose the silicon nitride layer and form a planar surface;

patterning the silicon nitride layer to form a plurality of coding areas;

forming a polysilicon layer to cover the coding areas as well as any other exposed surfaces;

patterning the polysilicon layer to form a plurality of parallel word lines extending in a second direction perpendicular to the first direction, the word lines covering the coding areas and crossing the bit lines, with an area where each word line crosses with two adjacent bit lines forming a read only memory cell; and performing a self-aligned coding operation to define the read only memory cells as having an ON or OFF state.

2. The method recited in claim 1, wherein said implanting ions includes implanting N-type ions.

3. The method recited in claim 1, wherein said forming a sidewall spacer includes composing the sidewall spacers of silicon dioxide.

4. The method recited in claim 1, wherein said forming a silicide layer comprises using a self-alignment process.

5. The method recited in claim 1, wherein said forming a silicide layer includes composing the silicide layer of titanium silicide.

6. The method recited in claim 1, wherein said forming a silicide layer includes composing the silicide layer of tungsten silicide.

7. The method recited in claim 1, wherein said forming an insulating layer includes composing the insulating layer of silicon dioxide.

8. The method recited in claim 1, wherein said forming an insulating layer includes composing the insulating layer of boro-phosphosilicate glass.

9. The method recited in claim 1, wherein said removing a portion of the insulating layer includes removing the portion using a chemical-mechanical polishing technique.

10. The method recited in claim 1, wherein said performing a self-aligned coding operation includes defining the state of each memory cell using a P-type ion implantation process.

11. The method recited in claim 1, further comprising forming metallic wirings and passivation layers after said performing a self-aligned coding operation.

12. A method of making a memory unit for a read only memory device, comprising:

forming a gate oxide layer and a silicon nitride layer in sequence above a silicon substrate;

etching the gate oxide layer and the silicon nitride layer to define a plurality of parallel strips extending in a first direction;

implanting ions, using the parallel strips as masks, into the silicon substrate to form a plurality of buried bit lines extending in the first direction;

forming a sidewall spacer on respective sidewalls of the parallel strips;

forming a silicide layer over an exposed surface of the respective bit lines;

forming an insulating layer covering any exposed surfaces, and filling a space located between adjacent parallel strips and above the bit lines;

removing a portion of the insulating layer to expose the silicon nitride layer and form a planar surface;

patterning the silicon nitride layer to form a plurality of coding areas;

forming a polysilicon layer to cover the coding areas as well as any other exposed surfaces; and patterning the polysilicon layer to form a plurality of parallel word lines extending in a second direction perpendicular to the first direction, the word lines covering the coding areas and crossing the bit lines, with an area where each word line crosses with two adjacent bit lines forming a read only memory cell.

13. A method of making a memory unit for a read only memory device, comprising:

forming a plurality of parallel strips of silicon nitride over a silicon substrate;

implanting ions, using the parallel strips as masks, into the silicon substrate to form a plurality of buried bit lines extending in the same direction as the parallel strips;

forming a suicide layer over an exposed surface of the respective bit lines to increase the conductivity of the bit lines;

forming an insulating layer covering any exposed surfaces, and filling a space located between adjacent parallel strips and above the bit lines;

removing a portion of the insulating layer to expose the silicon nitride layer and form a planar surface;

patterning the silicon nitride layer to form a plurality of coding areas;

forming a polysilicon layer to cover the coding areas as well as any other exposed surfaces; and patterning the polysilicon layer to form a plurality of parallel word lines extending in a second direction perpendicular to the first direction, the word lines covering the coding areas and crossing the bit lines, with an area where each word line crosses with two adjacent bit lines forming a read only memory cell.

* * * * *